(12) United States Patent
Audet et al.

(10) Patent No.: US 10,460,956 B2
(45) Date of Patent: Oct. 29, 2019

(54) INTERPOSER WITH LATTICE CONSTRUCTION AND EMBEDDED CONDUCTIVE METAL STRUCTURES

(71) Applicant: International Business Machines Corporation, Armonk, NY (US)

(72) Inventors: Jean Audet, Granby (CA); Benjamin V. Fasano, New Windsor, NY (US); Shidong Li, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 170 days.

(21) Appl. No.: 15/255,244

(22) Filed: Sep. 2, 2016

(65) Prior Publication Data

US 2016/0372337 A1 Dec. 22, 2016

Related U.S. Application Data

(63) Continuation of application No. 14/571,352, filed on Dec. 16, 2014, now Pat. No. 9,443,799.

(51) Int. Cl.
*H01L 21/48* (2006.01)
*H01L 23/498* (2006.01)
(Continued)

(52) U.S. Cl.
CPC ........ *H01L 21/486* (2013.01); *H01L 21/0274* (2013.01); *H01L 23/15* (2013.01);
(Continued)

(58) Field of Classification Search
CPC ............. H01L 23/49827; H01L 21/486; H01L 23/49894; H01L 23/49838; H01L 23/15;
(Continued)

(56) References Cited

U.S. PATENT DOCUMENTS 5,262,662 A 11/1993 Gonzalez et al.
5,949,030 A 9/1999 Fasano et al.
(Continued)

OTHER PUBLICATIONS

Daubenspeck, T.H., et al., "IBM Worldwide Packaging and Test-Evaluation of HD4004 Photosensitive Polyimide for Semiconductor Applications", Symposium on Polymers, May 5, 2004, IBM Corporation.
(Continued)

*Primary Examiner* — Tucker J Wright
*Assistant Examiner* — Thai T Vuong
(74) *Attorney, Agent, or Firm* — Scully, Scott, Murphy & Presser, P.C.; Steven J. Meyers

(57) ABSTRACT

A lattice structure is formed in a non-silicon interposer substrate to create large cells that are multiples of through hole pitches to act as islands for dielectric fields. Each unit cell is then filled with a dielectric material. Thereafter, holes (i.e., through holes or blind holes) are created within the dielectric material in the cells. After hole formation, a conductive metal is formed into each of the holes providing an interposer. This method can enable fine pitch processing in organic-based materials, isolates the thermal coefficient of expansion (TCE) stress from metal vias to low TCE carriers and creates a path to high volume, low costs components in panel form.

17 Claims, 6 Drawing Sheets

(51) Int. Cl.
*H01L 23/15* (2006.01)
*H01L 21/027* (2006.01)
*H01L 25/065* (2006.01)

(52) U.S. Cl.
CPC .. *H01L 23/49816* (2013.01); *H01L 23/49827* (2013.01); *H01L 23/49838* (2013.01); *H01L 23/49894* (2013.01); *H01L 25/0655* (2013.01); *H01L 2924/0002* (2013.01)

(58) Field of Classification Search
CPC ............. H01L 21/0274; H01L 25/0655; H01L 23/49816; H01L 2924/0002
USPC ........................................................ 257/777
See application file for complete search history.

(56) References Cited

U.S. PATENT DOCUMENTS

| | | | |
|---|---|---|---|
| 8,242,604 | B2 | 8/2012 | Volant et al. |
| 2005/0133930 | A1 | 6/2005 | Savastisuk et al. |
| 2005/0230841 | A1 | 10/2005 | Walk et al. |
| 2006/0001174 | A1 | 1/2006 | Matsui |
| 2006/0163740 | A1 | 7/2006 | Ohno et al. |
| 2010/0244251 | A1* | 9/2010 | Torazawa .......... H01L 21/76805 257/741 |
| 2010/0301485 | A1 | 12/2010 | Sekine et al. |
| 2011/0108986 | A1* | 5/2011 | Lin .................... H01L 21/76844 257/751 |
| 2011/0291264 | A1 | 12/2011 | Choi et al. |
| 2012/0013004 | A1 | 1/2012 | Suthiwongsunthorn et al. |
| 2012/0056329 | A1 | 3/2012 | Pagaila et al. |
| 2012/0146209 | A1 | 6/2012 | Hu et al. |
| 2012/0313255 | A1 | 12/2012 | Oganesian |
| 2013/0075930 | A1 | 3/2013 | Sekine et al. |
| 2013/0119555 | A1 | 5/2013 | Sundaram et al. |
| 2013/0181325 | A1* | 7/2013 | Chen ................ H01L 23/49827 257/532 |
| 2013/0186943 | A1 | 7/2013 | Sekine et al. |
| 2013/0233609 | A1 | 9/2013 | Kummerl |
| 2014/0034374 | A1 | 2/2014 | Cornejo et al. |
| 2014/0035892 | A1* | 2/2014 | Shenoy ................ G09G 3/3266 345/205 |
| 2014/0144681 | A1* | 5/2014 | Pushparaj ........... C03C 17/3435 174/257 |
| 2014/0264344 | A1 | 9/2014 | Liao |
| 2015/0035164 | A1 | 2/2015 | Ma et al. |
| 2015/0129285 | A1* | 5/2015 | Hu ........................ H05K 1/112 174/251 |
| 2015/0216047 | A1 | 7/2015 | Liao |
| 2015/0235991 | A1 | 8/2015 | Gu et al. |
| 2015/0303111 | A1 | 10/2015 | Lei et al. |
| 2015/0325508 | A1 | 11/2015 | Chen et al. |
| 2015/0348873 | A1 | 12/2015 | Katkar et al. |
| 2015/0348940 | A1 | 12/2015 | Woychik et al. |

OTHER PUBLICATIONS

Tecnisco, "Mesh Glass", http://www.tecnisco.co.jp/en/en_product/en_glass/en_mesh/index.html, printed on Dec. 3, 2014, 3 pages.
Photofabrication Engineering Inc., "Design Guides", http://www.photofabrication.com/design-guides/, printed on Dec. 3, 2014, 9 pages.
Hi Nano Micromachining Services—Products and Services, http://www.hinanomms.com/Products_Services/Products01.html, printed on Dec. 3, 2014, 2 pages.
Bakir, M. S., et al., "3D IC and Interposer Interconnect Technologies and Design", Georgia Institute of Technology, Apr. 7, 2014, 53 pages.
List of IBM Patents or Patent Applications Treated as Related, dated Sep. 2, 2016, 2 pages.

* cited by examiner

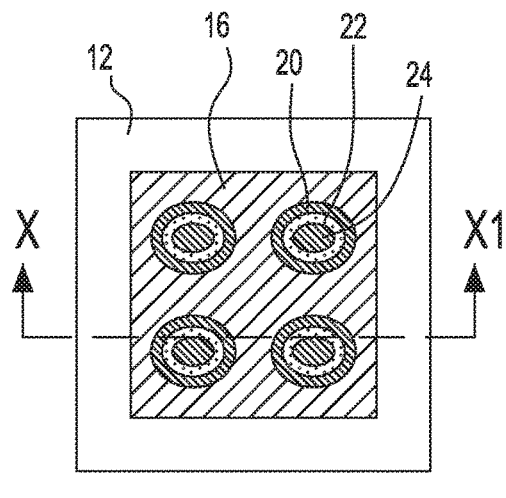 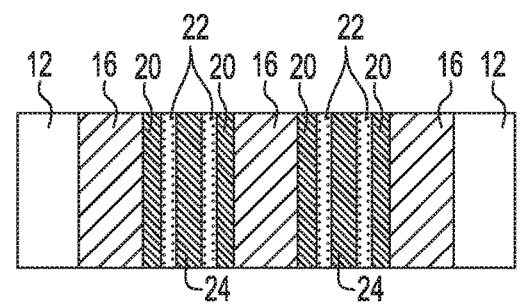
FIG. 9A  FIG. 9B
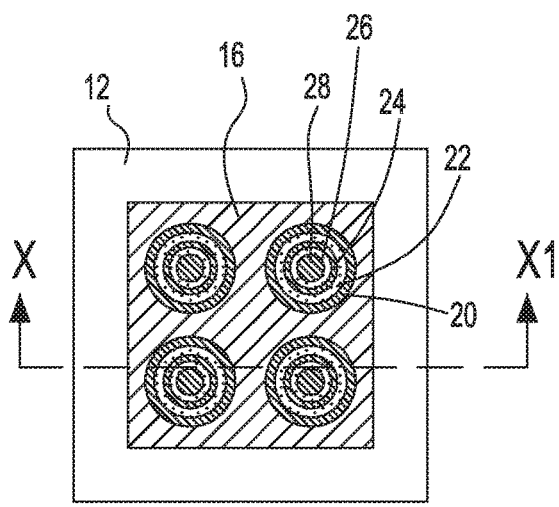 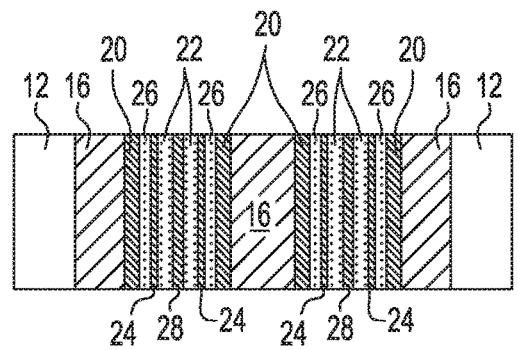
FIG. 10A  FIG. 10B

INTERPOSER WITH LATTICE CONSTRUCTION AND EMBEDDED CONDUCTIVE METAL STRUCTURES

BACKGROUND

The present application relates to semiconductor manufacturing. More particularly, the present application relates to an interposer that includes a non-silicon interposer substrate having a lattice framework and a plurality of unit cells formed therein. Each unit cell includes a plurality of conductive metal structures embedded in, and laterally surrounded by, a dielectric material.

To improve the level of integration and connectivity between semiconductor wafers, various stacking technologies have been proposed to increase the functionality by aggregating discrete components at very fine interconnect pitches onto a single planar carrier or interposer. Silicon has been the material of choice for prior interposers because there is a known supply chain, process tooling set and knowledge base for creating high density interconnects on silicon. Silicon as an interposer however has drawbacks. For example, the semiconductor behavior of silicon requires electrical isolation at all conductor interfaces. Also, silicon has a fixed thermal coefficient of expansion (TCE) of about 2.6 ppm/° C. that limits the maximum cross-sectional area of conductive filled vias in thermal cycling/reliability tests and subsequent BA operations to common laminates (with TCEs of approximately 10-12 ppm/° C.), again with reliability implications.

Glass interposers have been touted as a replacement for silicon interposers due to their better electrical resistance and availability of higher TCEs. One major problem with glass is the immature processes for creating holes in the 10-30 µm range. Lasers, machining, electrochemical machining, wet etching, which have traditionally be employed to create holes into glass, all have issues with either minimum feature size or throughput in the hours/days at via densities of interest which drive very expensive and/or high tooling unit purchase. A need therefore exists for providing a simple and cost efficient method for creating glass interposers with small holes (30 µm or below). In particular this need is highlighted for large panel size starting materials to facilitate economy of scale cost reductions vs. 300 mm diameter current limitations in wafer processing tools and platforms.

SUMMARY

A lattice structure (i.e., framework) is formed in a non-silicon interposer substrate to create large cells that are multiples of through hole pitches to act as islands for dielectric fields. The term "non-silicon interposer substrate" is used throughout the present application to denote an interposer substrate that comprises a material(s) other than solely elemental silicon. Each unit cell is then filled with a dielectric material. Thereafter, holes (i.e., through holes or blind holes) are created within the dielectric material in the cells. After hole formation, a conductive structure including a conductive metal or metal alloy is formed into each of the holes. This method can enable fine pitch processing in organic-based materials, isolate the thermal coefficient of expansion (TCE) stress from metal vias to low TCE carriers and create a path to high volume, low costs components in panel form.

In one aspect of the present application, a method of forming an interposer is provided. The method includes creating a lattice structure having a plurality of unit cells in a non-silicon interposer substrate. Each unit cell of the plurality of unit cells is then filled with a dielectric material. A plurality of holes is then formed into the dielectric material of each unit cell. A conductive structure is then formed into each hole of the plurality of holes.

In another aspect of the present application, an interposer is provided. The interposer of the present application includes a lattice structure comprising a non-silicon interposer material and having a plurality of unit cells disposed therein. Each unit cell of the plurality of unit cells includes a plurality of conductive structures embedded in, and laterally surrounded by, a dielectric material.

In yet another aspect of the present application, a semiconductor structure is provided. The semiconductor structure of the present application includes an interposer disposed between a first substrate and a second substrate, wherein the interposer includes a lattice structure comprising a non-silicon interposer material and having a plurality of unit cells disposed therein. Each unit cell of the plurality of unit cells includes a plurality of conductive structures embedded in, and laterally surrounded by, a dielectric material.

BRIEF DESCRIPTION OF SEVERAL VIEWS OF THE DRAWINGS

FIG. 9A is a top-down view illustrating the unit cell illustrated in FIG. 6A after forming another conductive structure within the unit cell.

FIG. 9B is a cross sectional view of the exemplary structure shown in FIG. 9A through vertical plane X-X1.

FIG. 10A is a top-down view illustrating the unit cell illustrated in FIG. 9A after forming a yet other conductive structure within the unit cell.

FIG. 10B is a cross sectional view of the exemplary structure shown in FIG. 10A through vertical plane X-X1.

DESCRIPTION

Figure 1A:
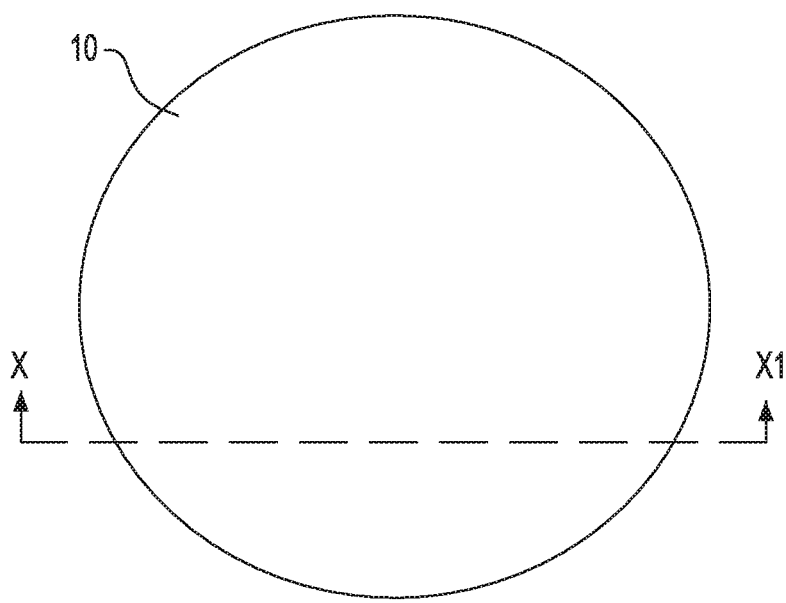
FIG. 1A is a top down view of an exemplary structure including a non-silicon interposer substrate that can be employed in one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
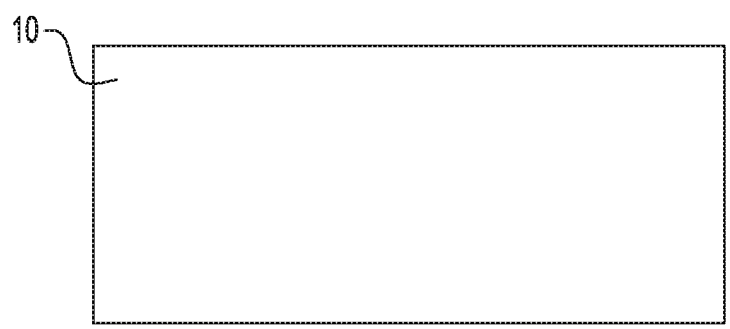
FIG. 1B is a cross sectional view of the exemplary structure of FIG. 1A through vertical plane X-X1 prior to processing.

Referring first to FIGS. 1A-1B, there are illustrated a non-silicon interposer substrate 10 that can be employed in one embodiment of the present application. The non-silicon interposer substrate 10 that can be employed in the present application includes any material other than solely elemental silicon. In one embodiment of the present application, the material(s) that can be employed as the non-silicon interposer substrate 10 may have a thermal coefficient of expansion of from 0 ppm/° C. to 15 ppm/° C., with the proviso that elemental silicon is not solely used. In another embodiment of the present application, the material(s) that can be employed as the non-silicon interposer substrate 10 may have a thermal coefficient of expansion of from 3 ppm/° C. to 10 ppm/° C. Examples of materials that can be used as the non-silicon interposer substrate 10 of the present application include, but are not limited to, glass, metals such as, for example, titanium, molybdenum, or tungsten, ceramic oxides such as alumina, or zirconia, toughed ceramic-fiber or organic-fiber composites, such as, for example, alumina toughened polyimides, or multilayered combinations thereof. In one embodiment of the present application, the non-silicon interposer substrate 10 comprises glass that has a thermal coefficient of expansion of from 3 ppm/° C. to 12 ppm/° C. In another embodiment, the non-silicon interposer substrate 10 comprises a titanium alloy that has a thermal coefficient of expansion of 7 ppm/° C. to 9 ppm/° C.

In some embodiments of the present application (and as illustrated in the drawings), the non-silicon interposer substrate 10 can be a stand-alone interposer substrate. In such an embodiment, no interposer carrier is required to be present beneath the non-silicon interposer substrate 10 during the processing steps of the present application. In other embodiments (not shown), an interposer carrier is located beneath the non-silicon interposer substrate 10 during the processing steps of the present application. In some embodiments in which an interposer carrier is employed, the interposer carrier that is employed can comprise a material that has a thermal coefficient of expansion that substantially matches the thermal coefficient of expansion of the non-silicon interposer substrate. By "substantially matches" it is meant a thermal coefficient of expansion value that is within ±5 ppm/° C. of the thermal coefficient of expansion value of the non-silicon interposer substrate 10.

The non-silicon interposer substrate 10 that can be employed in the present application may have a thickness from 50 µm to 500 µm. Other thickness that are lesser than or greater than the aforementioned thickness range can also be used as the thickness for the non-silicon interposer substrate 10.

The shape of the non-silicon interposer substrate 10 that is employed in the present application should be compatible with the process tooling used in the present application. As such, a panel can be used to create individual features of the present application with the intent of creating smaller units for making interposers. As an example, a large panel can be used to create multiple interposers which are subsequently cut from the panel in a form that is compatible with, for instance 300 mm wafer process tooling to finish the interposer patterning.

Figure 2:
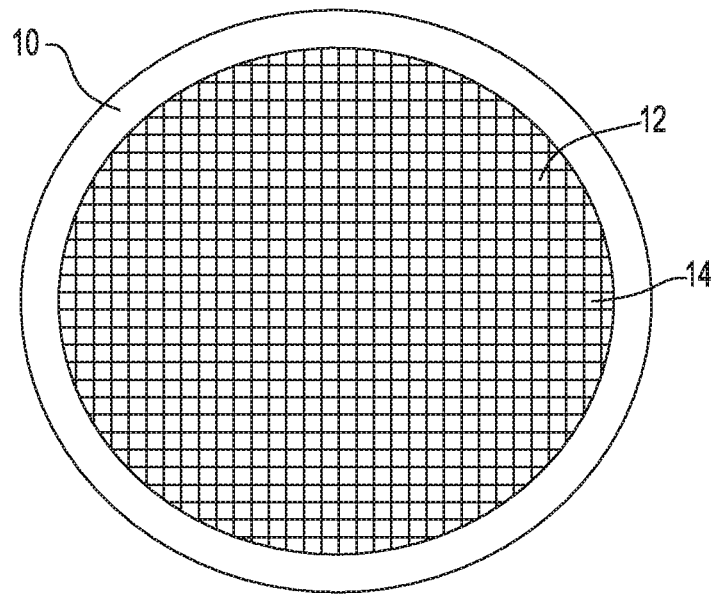
FIG. 2 is a top down view of the exemplary structure of FIGS. 1A-1B after creating a lattice structure having a plurality of unit cells in the non-silicon interposer substrate.

Referring now to FIG. 2, there is illustrated the exemplary structure of FIGS. 1A-1B after creating a lattice structure 12 having a plurality of unit cells 14 in the non-silicon interposer substrate 10. The lattice structure 12 which constitutes a remaining portion of the non-silicon interposer substrate 10, serves as a frame for each unit cell 14 that is formed into the non-silicon interposer substrate 10. The unit cells 14 are regularly shaped repeating holes that are formed into the non-silicon interposer substrate 10. Thus, the unit cells 14 may also be referred to as a 'sub-surface defined unit cells'. In some embodiments (not shown), the unit cells 14 can extend entirely through the non-silicon interposer substrate 10 creating through via holes. In other embodiments (and as illustrated in the drawings), the unit cells 14 are blind holes that have a bottommost surface that exposes a sub-surface of the non-silicon interposer substrate 10. By "sub-surface" it is meant a surface of the non-silicon interposer substrate 10 that is located beneath an original topmost surface of the non-silicon interposer substrate 10. In yet further embodiments, a first set of unit cells can extend entirely through the non-silicon interposer substrate 10, while a second set of unit cells can extend partially through the non-silicon interposer substrate 10.

In one embodiment of the present application, each unit cell 14 extends into the non-silicon interposer substrate 10 to a depth, as measured from the topmost surface of the non-silicon interposer substrate 10 to the exposed sub-surface of the non-silicon interposer substrate 10, of from 50 µm to 400 µm. Other depths which are lesser than or greater than the aforementioned range can also be employed as the depth of each unit cell 14.

In some embodiments of the present application, the lattice structure 12 may extend over the entire surface of the non-silicon interposer substrate 10. In other embodiments of the present application, the lattice structure 12 may be present in a predetermined region(s) of the non-silicon interposer substrate 10. For example, the lattice structure 12 may be formed within a central portion, i.e., away from edge portions, of the non-silicon interposer substrate 10.

Figure 7:
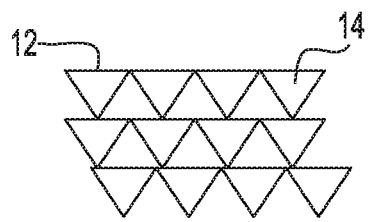
FIG. 7 shows a lattice structure having a plurality of triangular shaped unit cells that can be created and employed in the present application.
Figure 8:
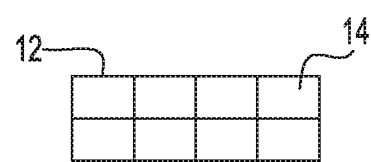
FIG. 8 shows a lattice structure having a plurality of rectangular shaped unit cells that can be created and employed in the present application.

In one embodiment, and as illustrated in FIG. 2, each unit cell 14 that is formed has a shape of a square. In such an embodiment, the width of the square shape unit cell 14, as measured from one sidewall surface of a lattice structure 12 to an opposing sidewall surface of a lattice structure 12, can be from 100 µm to 500 µm. Other shapes for the unit cells 14 are possible. For example, unit cells 14 having a triangular shape (as shown in FIG. 7) or unit cells 14 having a rectangular shape (as shown in FIG. 8) can also be formed and used in the present application. Also, and in some embodiments of the present application, it is possible to form different shaped unit cells 14 in the same non-silicon interposer substrate 10 by using block mask technology.

The lattice structure 12 including the unit cells 14 can be formed by a patterning process. Examples of patterning processes that can be used in the present application to provide the structure shown in FIG. 2 can include, but are not limited to, machining, laser ablation, etching, drilling, blasting or any combination thereof.

Figure 3A:
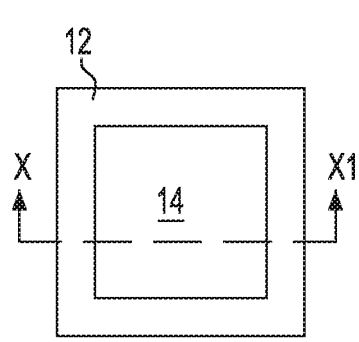
FIG. 3A is a magnified top down view of the exemplary structure shown in FIG. 2 illustrating one of the unit cells that is surrounded by a framework structure comprising a remaining portion of the non-silicon interposer substrate.
Figure 3B:
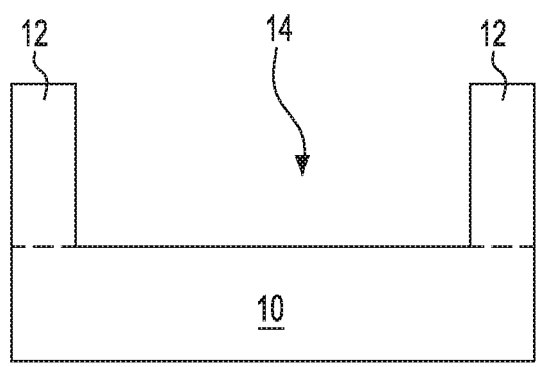
FIG. 3B is a cross sectional view of the exemplary structure shown in FIG. 3A through vertical plane X-X1.

Referring now to FIGS. 3A-3B, there are illustrated an enlarged view (top and cross sectional, respectively) of one of the unit cells 14 that is formed as described hereinabove and as shown in FIG. 2. As shown in FIGS. 3A-3B, the enlarged unit cell 14 is surrounded by a lattice structure 12 that constituents a remaining portion of the non-silicon interposer substrate 10 that frames the unit cell 14. In the drawings, an embodiment of the present application is shown in which the unit cell 14 is a square shaped blind hole that is formed into an upper portion of the non-silicon interposer substrate 10.

Figure 4A:
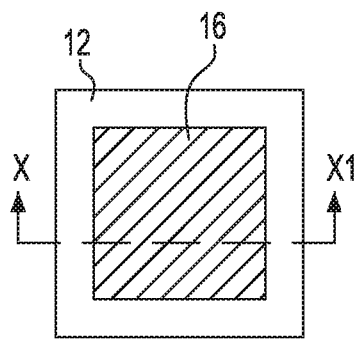
FIG. 4A is a top down view of the unit cell illustrated in FIG. 3A after providing a dielectric material in the unit cell.
Figure 4B:
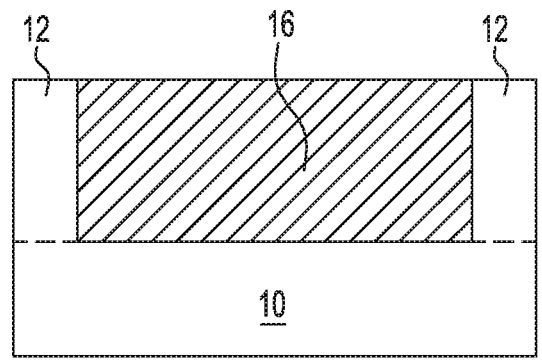
FIG. 4B is a cross sectional view of the exemplary structure shown in FIG. 4A through vertical plane X-X1.

Referring now to FIGS. 4A-4B, there is shown the unit cell illustrated in FIGS. 3A-3B after providing a dielectric material 16 into each unit cell 14. Although not shown, each unit cell 14 that is formed into the non-silicon interposer substrate 10 is processed to include dielectric material 16 filling the entirety of each unit cell 14.

The dielectric material 16 that can be employed in the present application is a polymeric material (i.e., homopolymers, copolymers, etc.) which has an elastic modulus that is less than the elastic modulus of the non-silicon interposer substrate 10. As known to those skilled in the art, the elastic modulus is a number that measures an object or substance's resistance to being deformed elastically (i.e., non-permanently) when a force is applied to it. The elastic modulus of an object is defined as the slope of its stress-strain curve in the elastic deformation region. In one embodiment of the present application, the dielectric material 16 has an elastic modulus, i.e. Young's modulus, of from 5 GPa to 15 GPa.

In one embodiment of the present application, the dielectric material 16 that can be employed in the present application has a thermal coefficient of expansion of from 5 ppm/° C. to 15 ppm/° C. In another embodiment of the present application, the dielectric material 16 that can be employed in the present application has a thermal coefficient of expansion of from 10 ppm/° C. to 12 ppm/° C.

In one embodiment of the present application, the dielectric material 16 that can be employed is a photo active (i.e., photo imageable) dielectric material; such dielectric materials can be directly patterned by exposure to photoelectric energy and development. By "photo active (or photo imageable) dielectric material" it is meant a polymeric material such as, for example, a polyimide, a polysilsequioxane, a polycarbonate, a polysiloxane, a fluorinate polyhydrocarbon, a polysilane, a polycarbosilane, a polyoxycarbosilane, a polyorganosilicates, parlene-F, or parlene-N, that is sensitive to the exposure of photoelectric energy. This sensitivity to the exposure of photoelectric energy results in changing the chemical composition of the dielectric material upon exposure by light energy. In some embodiments of the present invention, dielectric material 16 can be a photoresist material including, for example, positive-tone photoresist materials, negative-tone photoresist materials or hybrid photoresist materials.

The photo-active dielectric material that provides dielectric material 16 may be a component of a photoresist composition that may further include a photoacid generator, a base additive and a solvent. The photoacid generators, base additives and solvents are well known to those skilled in the art and, as such, details regarding those components are not fully provided.

In another embodiment of the present application, the dielectric material 16 that can be employed is a non-photo active (i.e., photo imageable) dielectric material; such dielectric materials cannot be directly patterned by exposure to photoelectric energy and development. Examples of non-photo active dielectric materials include, but are not limited to, polyepoxides, polyimides, or polybenzoxazoles.

Notwithstanding the type of polymeric material employed as dielectric material 16, the dielectric material 16 can be formed by depositing a composition containing either a photo active dielectric material or a non-photo active photo active dielectric material filling each unit cell 14. The deposition process that can provide the dielectric material 16 may include, for example, spin-on-coating, spray coating, dip coating, brush coating, screen printing or evaporation. After depositing the composition containing either the photo active dielectric material or the non-photo active photo active dielectric material, the deposited composition can be subjected to a post deposition baking step and/or curing step that converts the deposited composition into dielectric material 16.

The post deposition baking step which may be employed serves to remove unwanted components, such as solvents, from the deposited composition. When performed, the post deposition baking step is typically conducted at a temperature from about 60° to about 200° C. The post deposition baking step can be performed in an inert ambient such as, for example, helium, argon, neon or mixtures thereof.

The curing step which may be employed serves to toughen or harden the deposited composition containing either the photo active dielectric material or the non-photo active photo active dielectric material by cross-linking of polymer chains. The crosslinking may be achieved by electron beams, heat or chemical additives. The curing step may be performed with or without and intermediate post-deposition step as described above. Curing may be performed by a thermal cure, an electron beam cure, an ultra-violet (UV) cure, an ion beam cure, a plasma cure, a microwave cure, an additive cure or any combination thereof. The conditions for each of the curing processes, as well as curing additives, are well known to those skilled in the art.

In some embodiments of the present application, a planarization such as, for example, chemical mechanical planarization and/or grinding, may be performed to remove any dielectric material 16 that forms on the topmost surface of the lattice structure 12. In some embodiments, no planarization is necessary.

The dielectric material 16 that is formed into each unit cell 14 fills the entirety of each unit cell (no visible voids are present) and the dielectric material 16 has a topmost surface that is coplanar with a topmost surface of the lattice structure 12. In some embodiments of the present application, and when the unit cell 14 extends completely through the non-silicon interposer substrate 10, the dielectric material 16 has a bottommost surface that is coplanar with a bottommost surface of the non-silicon interposer substrate 10.

Figure 5A:
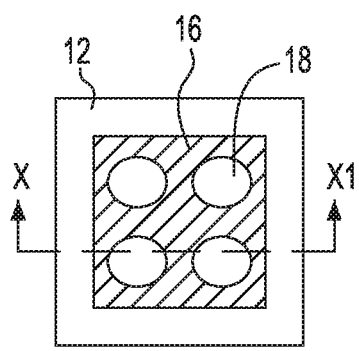
FIG. 5A is a top down view of the dielectric material filled unit cell illustrated in FIG. 4A after forming a plurality of holes into the dielectric material.
Figure 5B:
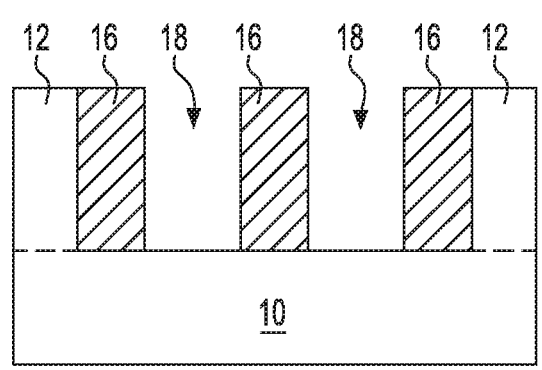
FIG. 5B is a cross sectional view of the exemplary structure shown in FIG. 5A through vertical plane X-X1.

Referring now to FIGS. 5A-5B, there are illustrated the dielectric material filled unit cell (14/16) illustrated in FIGS. 4A-B after forming a plurality of holes 18 into the dielectric material 16 that filled each unit cell 14. The holes 18 that are formed into the dielectric material 16 have smaller dimensions that the unit cells 14 that were formed into the non-silicon interposer substrate 10. The number of holes 18 that are formed into each unit cell is not limited so long as each hole 18 is surrounded by dielectric material 16. For example, 2, 3, 4, 5, 6, etc., holes 18 can be formed. The shape of the holes 18 can also vary. For example, circular holes, square holes, rectangular holes and triangular holes can be formed; the drawings show circular holes. In some embodiments (not shown), the holes 18 can extend completely through the dielectric material 16. In other embodiments (as shown), the holes 18 can extend partially through the dielectric material 16. In such an embodiment, each hole 18 exposes a sub-surface of the dielectric material 16. In yet further embodiments (also not shown), a first set of holes 18 can extend entirely through the dielectric material 16, while a second set of holes 18 can extend partially through the dielectric material 16.

In one embodiment of the present application, each hole 18 extends into the dielectric material 16 to a depth, as measured from the topmost surface of the dielectric material 16 to the exposed sub-surface of the dielectric material 16, of from 50 μm to 400 μm. Other depths which are lesser than or greater than the aforementioned range can also be employed as the depth of each hole 18. Holes 18 having multiple depths are also possible and can be formed utilizing block mask technology. These may be desired in locations where, for instance blind vias are needed for mechanical anchoring of surface features without creating an electrically conductive path to the bottom surface of the interposer.

In some embodiments of the present application and when the dielectric material 16 is made from a photo active dielectric, the holes 18 can be formed by lithography only. That is, the holes 18 can be formed by directly exposing the dielectric material 16 to irradiation and then developing the exposed dielectric material utilizing a conventional developer solution. In other embodiments of the present application, the holes 18 can be formed by drilling, wet etching, dry etching, electric discharge machining, or any combination thereof. In some embodiments, the holes can be formed utilizing a combination of lithography and etching. In such an embodiment, a separate photoresist material can be formed atop the dielectric material and thereafter hole patterns can be formed into the separate photoresist material by exposing the resist material to irradiation and resist development. Next, the hole patterns are transferred into the dielectric material 16 by etching (dry etching or wet etching) and thereafter the resist material can be stripped utilizing a conventional resist stripping process such as, for example ashing.

Figure 6A:
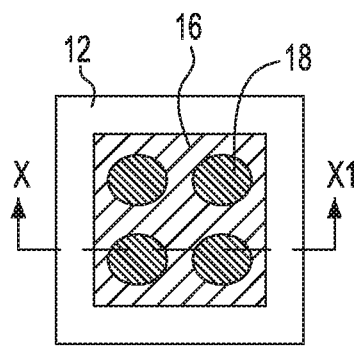
FIG. 6A is a top down view of the unit cell illustrated in FIG. 5A after forming a conductive structure in each hole of the plurality of holes and planarization.
Figure 6B:
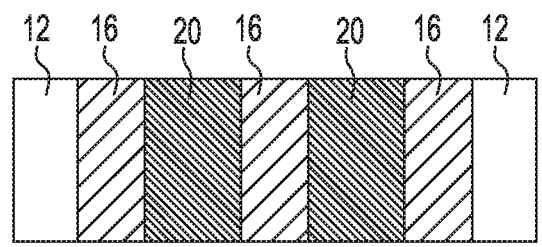
FIG. 6B is a cross sectional view of the exemplary structure shown in FIG. 6A through vertical plane X-X1.

Referring now to FIGS. 6A-6B, there are illustrated the unit cell illustrated in FIGS. 5A-5B after forming a conductive structure 20 in each hole 18 of the plurality of holes and planarization. Notably, FIGS. 6A-6B illustrated an interposer in accordance with an embodiment of the present application which includes a lattice structure 12 comprising a non-silicon interposer material and having a plurality of unit cells 14 disposed therein, wherein each unit cell of said plurality of unit cells 14 includes a plurality of conductive structures 20 embedded in, and laterally surrounded by, a dielectric material 16.

In one embodiment of the present application, and as shown, the entire volume of each hole 18 is occupied by a conductive structure 20 that comprises a single conductive metal or metal alloy. In another embodiment of the present application, conductive structure 20 comprises a multilayered stack of conductive metal and/metal alloy. In yet another embodiments, a first set of conductive structures can comprise a single conductive metal or metal alloy, while a second set of conductive structures can comprise a multi-layered stack of conductive metal and/metal alloy.

In some embodiments, and as will be described herein below and as shown in FIGS. 9A-9B, each hole 18 may include a first conductive structure 20 in direct contact with sidewall surfaces of the dielectric material 16, another dielectric material 22 in direct contact with sidewall surface of the first conductive structure 20, and a second conductive structure 24 in direct contact with a sidewall surface of the another dielectric material 22. In some embodiments, and as will be described herein below and as shown in FIGS. 10A-10B, each hole 18 may include a first conductive structure 20 in direct contact with sidewall surfaces of the dielectric material 16, another dielectric material 22 in direct contact with sidewall surface of the first conductive structure 20, a second conductive structure 24 in direct contact with a sidewall surface of the another dielectric material 22, a further dielectric material 26 in direct contact with sidewall surface of the second conductive structure 24, and a third conductive structure 28 in direct contact with a sidewall surface of the further dielectric material 26. The application is not limited to only three conductive structures being formed into each hole 18, instead, a plurality of conductive structures each embedded within, and laterally surrounded by a dielectric material can be formed into each hole 18.

In some embodiments, an optional plating seed layer (not specifically shown) can be formed on exposed surfaces within the hole 18 prior to formation of the conductive structure 20. The optional plating seed layer is employed to selectively promote subsequent electroplating of a pre-selected conductive metal or metal alloy. The optional plating seed layer may comprise Cu, a Cu alloy, Ir, an Ir alloy, Ru, a Ru alloy (e.g., TaRu alloy), Pt or any other suitable noble metal or noble metal alloy having a low metal-plating overpotential. Typically, Cu or a Cu alloy plating seed layer is employed, when a Cu metal is to be subsequently formed within each hole 18. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, chemical vapor deposition (CVD), plasma enhanced chemical vapor deposition (PECVD), atomic layer deposition (ALD), wet chemical deposition, or physical vapor deposition (PVD).

Each conductive structure 20, 24, and 28 includes a conductive metal, conductive metal alloy or a conductive metal nitride. In one embodiment, the conductive structure 20, 24, and 28 comprises Cu, W, Al or alloys thereof such as a Cu alloy (such as AlCu). When more than one conductive structure is formed into a single hole, each conductive structure may comprise a same or a different conductive metal or metal alloy. The conductive structure 20, 24, and 28 can be formed by a deposition process including chemical vapor deposition (CVD), plasma enhanced chemical vapor deposition (PECVD), sputtering, chemical solution deposition or plating that fills the hole 18 from the bottom upwards. In another embodiment of the present application, the conductive structure 20, 24, and 28 can be formed utilizing a conductive fill paste process.

Following the filling of each hole 18 with the conductive metal or metal alloy that provides the conductive structure 20, 24, and 28, a planarization process such as, for example, chemical mechanical polishing (CMP) and/or grinding, can be used to remove any conductive metal or metal alloy outside the holes 18. The planarization stops on the topmost surface of the lattice structure 12. In some embodiments, planarization may be performed on a front side (i.e., same side of the non-silicon interposer substrate 10 containing holes 18) and a back side (i.e., a side opposite the surface of the non-silicon interposer substrate 10 in which each hole is formed into) providing planar front and back side surfaces as shown in FIG. 6B. In some embodiments of the present application and when each unit cell was only partially formed through the non-silicon interposer substrate 10, portions of the non-silicon interposer substrate 10 can be removed by (planarization and/or etching) to reveal the bottommost surface of the conductive structure 20, 24 and 28.

Referring now to FIGS. 9A-9B, there are illustrated the unit cell illustrated in FIGS. 6A-6B after forming another, i.e., second, conductive structure 24 within the unit cell 14 in accordance with another embodiment of the present application. In this embodiment, each hole 18 may include a first conductive structure 20 in direct contact with sidewall surfaces of the dielectric material 16, another dielectric material 22 in direct contact with sidewall surface of the first conductive structure 20, and a second conductive structure 24 in direct contact with a sidewall surface of the another dielectric material 22.

The structure shown in FIGS. 9A-9B is formed by first providing the structure shown in FIGS. 6A-6B without performing the planarization step; planarization is performed after all conductive structures are formed. After providing that structure, a hole is formed into each conductive structure 20 utilizing one of the hole forming processes mentioned above in forming hole 18 into dielectric material 16. After forming the hole into each conductive structure 20, another dielectric material is formed. The another dielectric material 22 may include one of the dielectric materials mentioned above for dielectric material 16. In some embodiments, the another dielectric material 22 may include a same dielectric material as dielectric material 16. In other embodiments, the another dielectric material 22 may comprise a different dielectric material than dielectric material 16. The another dielectric material 22 may be formed utilizing one of the techniques mentioned above in forming dielectric material 16. Following the formation of the another dielectric material 22, a hole is formed into the another dielectric material 22 utilizing one of the techniques mentioned above in forming hole 18. The second conductive structure 24 is then formed into this newly formed hole. The second conductive structure 24 may include a same or different conductive metal or metal alloy as conductive structure 20. Each hole that is formed in this embodiment, has a same shape as hole 18.

Referring now to FIGS. 10A-10B, there are illustrated the unit cell illustrated in FIGS. 9A-9B after forming a yet other, i.e., third, conductive structure 28 within the unit cell 14 in accordance with yet another embodiment of the present application. In this embodiment of the present application, each hole 18 may include a first conductive structure 20 in direct contact with sidewall surfaces of the dielectric material 16, another dielectric material 22 in direct contact with sidewall surface of the first conductive structure 20, a second conductive structure 24 in direct contact with a sidewall surface of the another dielectric material 22, a further dielectric material 26 in direct contact with sidewall surface of the second conductive structure 24, and a third conductive structure 28 in direct contact with a sidewall surface of the further dielectric material 26.

The structure shown in FIGS. 10A-10B is formed by first providing the structure shown in FIGS. 9A-9B without performing the planarization step; planarization is performed after all conductive structures are formed. After providing that structure, a hole is formed into each second conductive structure 24 utilizing one of the hole forming processes mentioned above in forming hole 18 into dielectric material 16. After forming the hole into each conductive structure 24, a further dielectric material 26 is formed. The further dielectric material 26 may include one of the dielectric materials mentioned above for dielectric material 16. The further dielectric material 26 can be the same or different from the dielectric material 16 and/or dielectric material 22. The further dielectric material 26 may be formed utilizing one of the techniques mentioned above in forming dielectric material 16. Following the formation of the further dielectric material 26, a hole is formed into the further dielectric material 26 utilizing one of the techniques mentioned above in forming hole 18. The third conductive structure 28 is then formed into this newly formed hole. The third conductive structure 18 may include a same or different conductive metal or metal alloy as conductive structure 20 and/or conductive structure 24. Each hole that is formed in this embodiment, has a same shape as hole 18.

Figure 11:
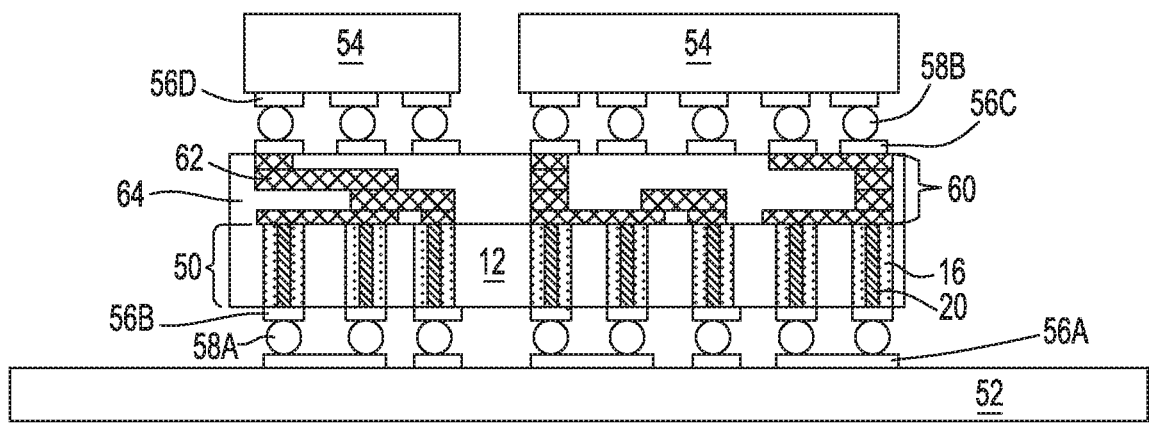
FIG. 11 is a cross sectional view illustrating a semiconductor structure of the present application including an interposer of the present application disposed between a first substrate and a second substrate.

Referring now to FIG. 11, there is illustrated a semiconductor structure of the present application including an interposer 50 of the present application disposed between a first substrate 52 and a second substrate 54. Interposer 50 includes a lattice structure 12 comprising a non-silicon interposer material and having a plurality of unit cells 14 disposed therein, wherein each unit cell of said plurality of unit cells includes a plurality of conductive structures 20 embedded in, and laterally surrounded by, a dielectric material 16. Interposer 50 can have metal bonding pads 56B (as are well known to those skilled in the art) located on at least one surface of the structure. In the illustrated embodiment, bonding pads 56B are located on a bottommost surface of each unit cell (comprising element 16 and 20). In some embodiments of the present application, first substrate 52 may include a ceramic or organic laminate as is well known to those skilled in the art. Metal bonding pads 56A can be located on a surface of the first substrate 52 and conventional solder balls 58A can be located between and in direct contact with each metal bonding pad 56A and 56B.

An optional interconnect structure 60 may be located between the interposer 50 and the second substrate 54. The optional interconnect structure 60 includes conductive lines/vias 62 embedded with a dielectric material 64. The optional interconnect structure 60 can be formed utilizing techniques well know to those skilled in the art. Metal bonding pads 56C can be located on a surface of the optional interconnect structure 60. When the optional interconnect structure 60 is omitted, the bonding pads 56C can be formed on a topmost surface of each unit cell (comprising elements 16 and 20). Second substrate 54 may include at least one silicon die with metal bonding pads 56D located on a surface thereof. Conventional solder balls 58B can be located between and in direct contact with each metal bonding pad 56C and 56D.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming an interposer, said method comprising:
   creating a lattice structure having a plurality of unit cells composed of regularly repeating openings having a first dimension in a non-silicon interposer substrate;
   filling an entirety of each unit cell of said plurality of unit cells with a dielectric material, wherein said dielectric material present in each unit cell has a topmost surface that is coplanar with a topmost surface of said lattice structure;
   forming a plurality of holes into said topmost surface of said dielectric material present in each unit cell, wherein each hole extends downward from said topmost surface of said dielectric material, has a second dimension that is less than said first dimension and is laterally surrounded by a remaining portion of said dielectric material; and
   forming a conductive structure in each hole of said plurality of holes, wherein each conductive structure has a topmost surface that is coplanar with said topmost surface of remaining portions of said dielectric material and said topmost surface of said lattice structure.

2. The method of claim 1, wherein said non-silicon interposer substrate comprises a material having a thermal coefficient of expansion of from 0 ppm/° C. to 15 ppm/° C.

3. The method of claim 2, wherein said material is glass.

4. The method of claim 1, wherein each unit cell of said plurality of unit cells is a square, a rectangle, or a triangle.

5. The method of claim 1, wherein said creating said lattice structure having said plurality of unit cells comprises machining, etching, drilling, or blasting.

6. The method of claim 1, wherein said forming said plurality of holes into said dielectric material of each unit cell comprises drilling, wet etching, dry etching, electric discharge machining, lithography or any combination thereof.

7. The method of claim 1, wherein at least a set of said plurality of unit cells extends only partially through said non-silicon interposer substrate, and wherein a step of removing portions of said non-silicon interposer substrate is performed after said forming said conductive structure to reveal a bottommost surface of said conductive structure.

8. The method of claim 1, wherein said units cells are regularly repeating holes that are formed in said non-silicon interposer substrate.

9. The method of claim 1, wherein said creating said lattice structure having said plurality of unit cells in said non-silicon interposer substrate comprises:
   patterning said non-silicon interposer substrate.

10. The method of claim 1, wherein said unit cells extend entirely through said non-silicon interposer substrate.

11. The method of claim 1, wherein said unit cells extend partially into said non-silicon interposer substrate.

12. The method of claim 1, wherein said dielectric material is a photo imageable dielectric material.

13. The method of claim 1, wherein said forming said plurality of holes into said dielectric material of each unit cell comprises:
   exposing said dielectric material to irradiation and developing said exposed dielectric material.

14. The method of claim 1, wherein each hole of said plurality of holes has a smaller dimension than said unit cell.

15. The method of claim 1, wherein each conductive structure comprises a single conductive metal or metal alloy.

16. The method of claim 1, wherein each conductive structure comprises a multilayered stack of conductive metal or metal alloys.

17. The method of claim 1, wherein said forming said conductive structure comprises deposition of a conductive metal or metal alloy and planarization.

* * * * *